US006665853B2

(12) United States Patent
LeCoz

(10) Patent No.: US 6,665,853 B2
(45) Date of Patent: Dec. 16, 2003

(54) NETLIST CONSISTENCY CHECKING

(75) Inventor: Christian R. LeCoz, Endwell, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/108,677

(22) Filed: Mar. 27, 2002

(65) Prior Publication Data

US 2003/0188285 A1 Oct. 2, 2003

(51) Int. Cl.[7] .............................................. G06F 17/50
(52) U.S. Cl. .............................. 716/12; 716/1; 716/12; 716/14
(58) Field of Search .............................. 716/1, 5, 4, 10, 716/11, 12, 13, 14, 15, 18; 703/14, 15

(56) References Cited

U.S. PATENT DOCUMENTS

| | | |
|---|---|---|
| 5,231,590 A | 7/1993 | Kumar et al. |
| 5,384,710 A | 1/1995 | Lam et al. |
| 5,463,561 A | 10/1995 | Razdan |
| 5,712,794 A | 1/1998 | Hong |
| 5,867,395 A | 2/1999 | Watkins et al. |
| 5,867,396 A | 2/1999 | Parlour |
| 5,901,066 A | 5/1999 | Hong |
| 5,910,898 A * | 6/1999 | Johannsen ............... 716/1 |
| 6,009,251 A | 12/1999 | Ho et al. |
| 6,009,252 A | 12/1999 | Lipton |
| 6,163,876 A * | 12/2000 | Ashar et al. ............. 716/5 |
| 6,190,433 B1 | 2/2001 | Van Fleet et al. |
| 6,226,777 B1 | 5/2001 | Zhang |
| 6,499,129 B1 * | 12/2002 | Srinivasan et al. ....... 716/4 |
| 2002/0138812 A1 * | 9/2002 | Johannsen ............... 716/5 |
| 2002/0162086 A1 * | 10/2002 | Morgan ................. 716/18 |

FOREIGN PATENT DOCUMENTS

JP 11102386 4/1999

OTHER PUBLICATIONS

Kim et al., A New Hierarchical Netlist Comparison Technique for Layout Verification, ICVC '97. 5th International Conference on VLSI and CAD. Kyungki–do, South Korea: Samsung Electron, 1997.

Kim et al., Hierarchy Restructing for Hierarchical LVS Comparison, VLSI Design, vol. 10, No. 1, 1999.

Kim et al., Hierarchical LVS Based on Hierarchy Rebuilding, Proceedings of the ASP–DAC '98, Asia and South Pacific Design Automation Conference 1988, p. cover and 379–384.

Batra et al. Hcompare: A Hierarchical Netlist Comparison Program, 29th ACM/IEEE Design Automation Conference, pp. 299–304.

* cited by examiner

*Primary Examiner*—Matthew Smith
*Assistant Examiner*—Binh Tat
(74) *Attorney, Agent, or Firm*—Schmeiser, Olsen & Watts; Arthur J. Samodovitz

(57) ABSTRACT

A method and computer system for checking a netlist N. An I/O connectivity list $I_1$ for a first electrical package $P_1$ is provided. $I_1$ includes I/O locations on a surface $S_1$ of the first electrical package $P_1$. An I/O connectivity list $I_2$ for a second electrical package $P_2$ is also provided. $I_2$ includes I/O locations on a surface $S_2$ of the second electrical package $P_2$. A netlist N that describes electrical nets between I/O locations on $S_1$ and I/O locations on $S_2$ is additionally provided. Denoting I as $I_1$ and $I_2$ collectively, a relationship exists between the I/O locations in N and the I/O locations in I, wherein the relationship is either a mutually consistent relationship or a mutually inconsistent relationship. The method and computer system determines whether the relationship is the mutually consistent relationship. An algorithm within the computer system may implement the method.

20 Claims, 10 Drawing Sheets

I/O CONNECTIVITY LIST $I_1$ OF I/O LOCATIONS
AND ASSOCIATED ENERGY TYPES ON SURFACE $S_1$
OF FIRST ELECTRICAL PACKAGE $P_1$

| Seq# | I/O Location | Energy Type |
|---|---|---|
| 1 | AB | GND |
| 2 | CF | GND |
| 3 | DW | GND |
| 4 | LM | VD1 |
| 5 | FA | VD1 |
| 6 | JS | VD2 |
| 7 | FF | NULL |
| 8 | ED | SIG33 |
| 9 | DM | SIG21 |
| 10 | CR | SIG44 |
| 11 | AL | SIG18 |
| 12 | XZ | NULL |
| 13 | SQ | PLL1 |
| 14 | DX | PLL2 |
| 15 | GS | TST1 |
| 16 | EE | TST2 |
| 17 | BF | GND |
| 18 | BH | SIG27 |

*FIG. 6A*

LIST OF COORDINATE VALUES AT EACH
I/O LOCATION ON SURFACE $S_1$
OF FIRST ELECTRICAL PACKAGE $P_1$

| I/OLocation | $X_1$ | $Y_1$ |
|---|---|---|
| AB | 50 | 60 |
| CF | 35 | 70 |
| DW | 80 | 10 |
| LM | 30 | 65 |
| FA | 65 | 90 |
| JS | 80 | 50 |
| FF | 75 | 25 |
| ED | 25 | 60 |
| DM | 30 | 80 |
| CR | 10 | 20 |
| AL | 60 | 55 |
| XZ | 90 | 55 |
| SQ | 45 | 40 |
| DX | 30 | 35 |
| GS | 45 | 50 |
| EE | 55 | 20 |
| BF | 10 | 85 |
| BH | 15 | 60 |

*FIG. 6B*

I/O CONNECTIVITY LIST $I_2$ OF I/O LOCATIONS AND ASSOCIATED ENERGY TYPES ON SURFACE $S_2$ OF SECOND ELECTRICAL PACKAGE $P_2$

| Seq# | I/O Location | Energy Type |
|---|---|---|
| 1 | A02 | GND |
| 2 | C06 | GND |
| 3 | D23 | GND |
| 4 | L13 | VD1 |
| 5 | F01 | VD1 |
| 6 | J19 | VD2 |
| 7 | F06 | NULL |
| 8 | E04 | SIG |
| 9 | D13 | SIG21 |
| 10 | C18 | SIG44 |
| 11 | A12 | SIG |
| 12 | X26 | NULL |
| 13 | S17 | PLL1 |
| 14 | D24 | PLL2 |
| 15 | G19 | TST1 |
| 16 | E05 | TST2 |
| 17 | B06 | GND |
| 18 | B08 | SIG |

FIG. 7A

LIST OF COORDINATE VALUES AT EACH I/O LOCATION ON SURFACE $S_2$ OF SECOND ELECTRICAL PACKAGE $P_2$

| I/O Location | $X_2$ | $Y_2$ |
|---|---|---|
| A02 | 150 | 260 |
| C06 | 135 | 270 |
| D23 | 180 | 210 |
| L13 | 130 | 265 |
| F01 | 165 | 290 |
| J19 | 180 | 250 |
| F06 | 175 | 225 |
| E04 | 125 | 260 |
| D13 | 130 | 280 |
| C18 | 110 | 220 |
| A12 | 160 | 255 |
| X26 | 190 | 255 |
| S17 | 145 | 240 |
| D24 | 130 | 235 |
| G19 | 145 | 250 |
| E05 | 155 | 220 |
| B06 | 110 | 285 |
| B08 | 115 | 260 |

FIG. 7B

NETLIST (L) OF NETS BETWEEN I/O LOCATIONS ON SURFACE $S_1$ OF FIG. 6A AND I/O LOCATIONS ON SURFACE $S_2$ OF FIG. 7A.

| Seq# | Energy Type | I/O Location of Surface $S_1$ | I/O Location of Surface $S_2$ |
|---|---|---|---|
| 1 | GND | U1.AB | J1.A02 |
| 2 | GND | U1.CF | J1.C06 |
| 3 | GND | U1.DV | J1.D23 |
| 4 | VD1 | U1.LM | J1.L13 |
| 5 | VD1 | U1.FA | J1.F01 |
| 6 | VD3 | U1.JS | J1.J19 |
| 7 | NULL | U1.FF | J1.F06 |
| 8 | SIG33 | U1.ED | J1.E04 |
| 9 | SIG21 | U1.DM | J1.D13 |
| 10 | SIG44 | U1.CR | J1.C18 |
| 11 | SIG18 | U1.AL | J1.A12 |
| 12 | NULL | U1.XZ | J1.X26 |
| 13 | PLL1 | U1.SQ | J1.S17 |
| 14 | PLL2 | U1.DX | J1.D24 |
| 15 | TST1 | U1.GS | J1.G19 |
| 16 | TST2 | U1.EE | J1.E05 |
| 17 | VD4 | U1.BF | J1.B06 |
| 18 | SIG28 | U1.BB | J1.B02 |

*FIG. 8*

OUTPUT FROM MUTUAL CONSISTENCY COMPARISONS

<u>I/O CONNECTIVITY LIST PARAMETERS UNMATCHED IN NETLIST</u>
    3 UNMATCHED I/O LOCATIONS: DW, BH, B08
    3 UNMATCHED GROUNDS AT I/O LOCATIONS: DW, BF, B06
    1 UNMATCHED VOLTAGES: VD2
    1 UNMATCHED SIGNALS: SIG27

<u>NETLIST PARAMETERS UNMATCHED IN I/O CONNECTIVITY LISTS</u>
    3 UNMATCHED I/O LOCATIONS: DV, BB, B02
    1 UNMATCHED GROUNDS AT I/O LOCATIONS: DV
    2 UNMATCHED VOLTAGES: VD3, VD4
    1 UNMATCHED SIGNALS: SIG28

*FIG. 9*

OUTPUT FROM MUTUAL CONSISTENCY COMPARISONS

<u>I/O CONNECTIVITY LIST PARAMETERS UNMATCHED IN NETLIST</u>
    0 UNMATCHED I/O LOCATIONS:
    0 UNMATCHED GROUNDS AT I/O LOCATIONS:
    0 UNMATCHED VOLTAGES:
    0 UNMATCHED SIGNALS:

<u>NETLIST PARAMETERS UNMATCHED IN I/O CONNECTIVITY LISTS</u>
    0 UNMATCHED I/O LOCATIONS:
    0 UNMATCHED GROUNDS AT I/O LOCATIONS:
    0 UNMATCHED VOLTAGES:
    0 UNMATCHED SIGNALS:

*FIG. 11*

REVISED NETLIST (L) OF NETS BETWEEN I/O LOCATIONS ON SURFACE S₁ OF FIG. 6A AND I/O LOCATIONS ON SURFACE S₂ OF FIG. 7A.

| Seq# | Energy Type | I/O Location of Surface $S_1$ | I/O Location of Surface $S_2$ |
|---|---|---|---|
| 1 | GND | U1.AB | J1.A02 |
| 2 | GND | U1.CF | J1.C06 |
| 3 | GND | U1.DW | J1.D23 |
| 4 | VD1 | U1.LM | J1.L13 |
| 5 | VD1 | U1.FA | J1.F01 |
| 6 | VD2 | U1.JS | J1.J19 |
| 7 | NULL | U1.FF | J1.F06 |
| 8 | SIG33 | U1.ED | J1.E04 |
| 9 | SIG21 | U1.DM | J1.D13 |
| 10 | SIG44 | U1.CR | J1.C18 |
| 11 | SIG18 | U1.AL | J1.A12 |
| 12 | NULL | U1.XZ | J1.X26 |
| 13 | PLL1 | U1.SQ | J1.S17 |
| 14 | PLL2 | U1.DX | J1.D24 |
| 15 | TST1 | U1.GS | J1.G19 |
| 16 | TST2 | U1.EE | J1.E05 |
| 17 | GND | U1.BF | J1.B06 |
| 18 | SIG27 | U1.BH | J1.B08 |

*FIG. 10*

NETLIST CONSISTENCY CHECKING

BACKGROUND OF THE INVENTION

1. Technical Field

The present invention relates to a method and computer system for checking a netlist for consistency with input/output connectivity lists.

2. Related Art

A customer may provide input/output connectivity lists for a Controlled Collapse Chip Connection (C4) chip and for a ball grid array (BGA) circuit card, for use in developing an input netlist file to a design software package. Unfortunately, the input netlist file for the design software package may have formatting constraints that result in errors when the data in the aforementioned input/output connectivity lists are utilized for developing said input file. Said errors constitute a quality assurance concern. Thus there is a need to effectively mitigate said errors.

SUMMARY OF THE INVENTION

In first embodiments, the present invention provides a method for checking a netlist L, comprising:

providing an I/O connectivity list $I_1$ for a first electrical package $P_1$, wherein $I_1$ includes I/O locations on a surface $S_1$ of the first electrical package $P_1$;

providing an I/O connectivity list $I_2$ for a second electrical package $P_2$, wherein $I_2$ includes I/O locations on a surface $S_2$ of the second electrical package $P_2$;

providing the netlist L that describes electrical nets between I/O locations on $S_1$ and I/O locations on $S_2$, wherein I denotes $I_1$ and $I_2$ collectively, wherein a relationship exists between L and I, wherein the relationship is selected from the group consisting of a mutually consistent relationship and a mutually inconsistent relationship, and wherein a first necessary condition for the relationship to be a mutually consistent relationship is that the I/O locations in L and the I/O locations in I are mutually consistent; and determining whether the relationship is the mutually consistent relationship.

In second embodiments, the present invention provides a computer system for checking a netlist L, comprising an algorithm adapted to:

access an I/O connectivity list $I_1$ for a first electrical package $P_1$, wherein $I_1$ includes I/O locations on a surface $S_1$ of the first electrical package $P_1$;

access an I/O connectivity list $I_2$ for a second electrical package $P_2$, wherein $I_2$ includes I/O locations on a surface $S_2$ of the second electrical package $P_2$;

access the netlist L that describes electrical nets between I/O locations on $S_1$ and I/O locations on $S_2$, wherein I denotes $I_1$ and $I_2$ collectively, wherein a relationship exists between L and I, wherein the relationship is selected from the group consisting of a mutually consistent relationship and a mutually inconsistent relationship, and wherein a first necessary condition for the relationship to be a mutually consistent relationship is that the I/O locations in L and the I/O locations in I are mutually consistent; and determine whether the relationship is the mutually consistent relationship.

The present invention effectively mitigates errors in an input netlist file to a design software package, wherein said errors relate to a utilization of C4 and BGA input/output connectivity lists.

BRIEF DESCRIPTION OF THE DRAWINGS

FIG. 6A depicts an input/output (I/O) connectivity list $I_1$ of I/O locations and associated energy types on a surface $S_1$ of first electrical package $P_1$, in accordance with embodiments of the present invention.

FIG. 6B depicts a list of cartesian coordinate values for each I/O location of the surface $S_1$ of first electrical package $P_1$ of FIG. 6A, in accordance with embodiments of the present invention.

FIG. 7A depicts an I/O connectivity list $I_2$ of I/O locations and associated energy types on a surface $S_2$ of second electrical package $P_2$, in accordance with embodiments of the present invention.

FIG. 7B depicts a list of cartesian coordinate values for each I/O location of the surface $S_2$ of second electrical package $P_2$ of FIG. 7A, in accordance with embodiments of the present invention.

FIG. 8 depicts a netlist L of nets between I/O locations on the surface $S_1$ of FIG. 6A and I/O locations on the surface $S_2$ of FIG. 7A, in accordance with embodiments of the present invention.

FIG. 9 depicts output resulting from mutual consistency comparisons between the I/O connectivity lists $I_1$ and $I_2$ of FIGS. 6A & 7A and the netlist L of FIG. 8, in accordance with embodiments of the present invention.

FIG. 10 depicts a revised netlist $L_1$ of nets between I/O locations on the surface $S_1$ of FIG. 6A and I/O locations on the surface $S_2$ of FIG. 7A where the revised netlist is a modification of the netlist L of FIG. 8, in accordance with embodiments of the present invention.

FIG. 11 depicts output resulting from mutual consistency comparisons between the I/O connectivity lists $I_1$ and $I_2$ of FIGS. 7A & 7B and the revised netlist $L_1$ of FIG. 10, in accordance with embodiments of the present invention.

DETAILED DESCRIPTION OF THE INVENTION

Figure 1:
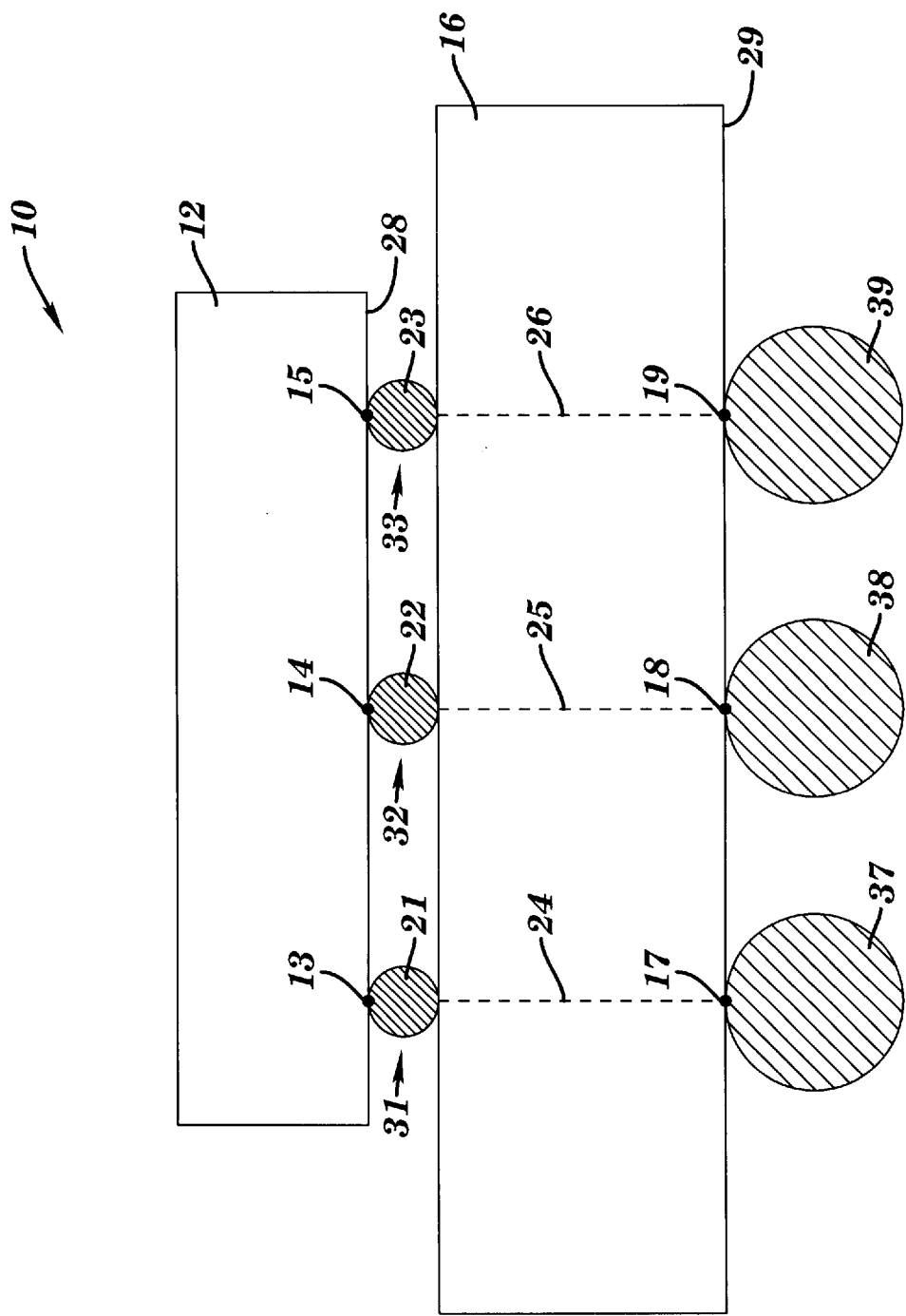
FIG. 1 depicts a front cross-sectional view of an electronic structure comprising a chip electrically coupled to a chip carrier by Controlled Collapse Chip Connection (C4) solder connections at a C4 surface of the chip, in accordance with embodiments of the present invention.

FIG. 1 depicts a front cross-sectional view of an electronic structure 10 comprising an integrated circuit chip 12 electrically coupled to a chip carrier 15 by Controlled Collapse Chip Connection (C4) solder connections at a surface 28 of the chip 12, in accordance with embodiments of the present invention. The C4 solder connections comprise C4 solder balls 21–23 at input/output (I/O) locations 13–15, respectively on the surface 28. The I/O locations 13–15 on the surface 28 are electrically coupled to ball grid array (BGA) solder balls 37–38 at I/O locations 17–19 on a surface 29 of the chip carrier 16, by use of electrical nets 31–33, respectively. The electrical net 31 comprises the C4 solder ball 21 and a net portion 24 interior to the chip carrier 16. The electrical net 32 comprises the C4 solder ball 22 and a net portion 25 interior to the chip carrier 16. The electrical net 33 comprises the C4 solder ball 23 and a net portion 26 interior to the chip carrier 16.

Figure 2:
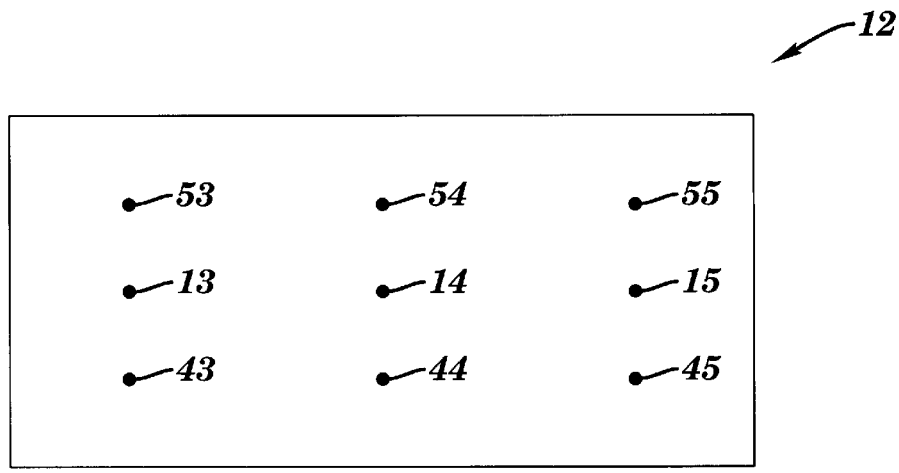
FIG. 2 depicts a planar view of the C4 surface of the chip in FIG. 1, in accordance with embodiments of the present invention.

FIG. 2 depicts a planar view of the surface 28 of the chip 12 in FIG. 1, in accordance with embodiments of the present invention. FIG. 2 shows the I/O locations 13–15 shown also in FIG. 1, as well as I/O location 43–45 and I/O location 53–55.

Figure 3:
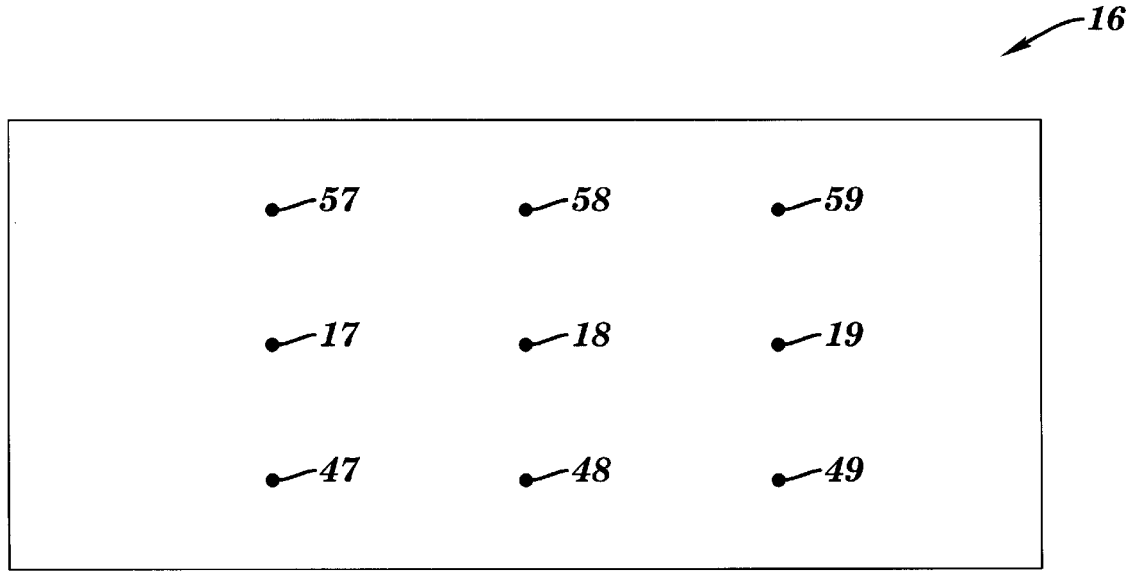
FIG. 3 depicts a planar view of a ball grid array (BGA) surface of the chip carrier in FIG. 1, in accordance with embodiments of the present invention.

FIG. 3 depicts a planar view of the surface 29 of the chip carrier 16 in FIG. 1, in accordance with embodiments of the present invention. FIG. 3 shows the I/O locations 17–19 shown also in FIG. 1, as well as I/O location 47–49 and I/O location 57–59.

Figure 4:
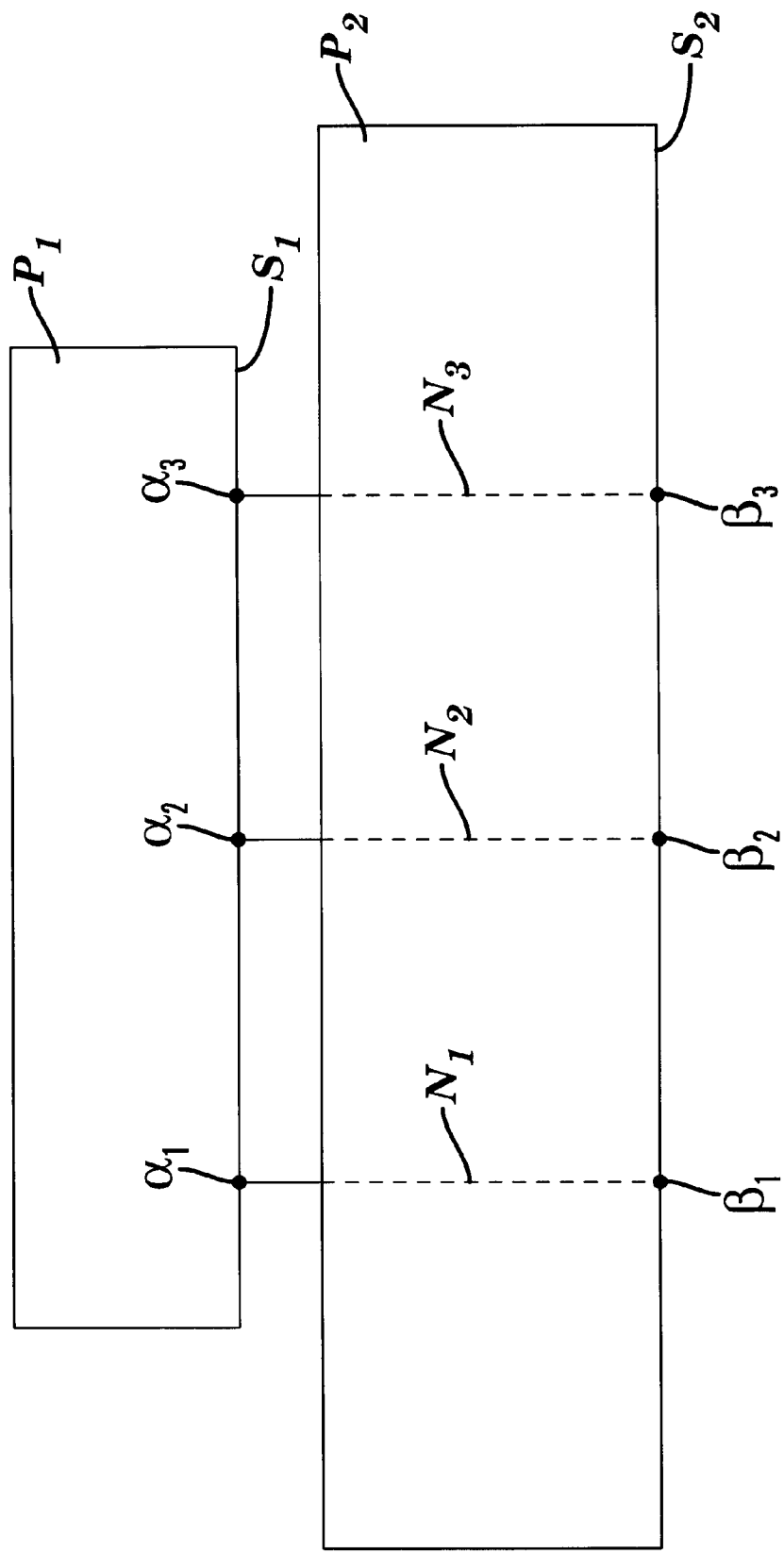
FIG. 4 depicts a front cross-sectional view of a general electronic structure, as abstracted from FIGS. 1–3, in accordance with embodiments of the present invention.

FIG. 4 depicts a front cross-sectional view of a general electronic structure, as abstracted from FIGS. 1–3, in accordance with embodiments of the present invention. The general electrical structure comprises a first electrical package $P_1$ and a second electrical package $P_2$, wherein the first electrical package $P_1$ is electrically coupled to the second electrical package $P_2$ by electrical nets $N_1, N_2, N_3, \ldots$ The electrical nets $N_1, N_2, N_3, \ldots$ respectively provide electrical coupling between the I/O locations $\alpha_1, \alpha_2, \alpha_3, \ldots$ on the surface $S_1$ and the I/O locations $\beta_1, \beta_2, \beta_3, \ldots$ on the surface $S_2$.

Referring to FIGS. 1–4: the first electrical package $P_1$ is embodied in the chip 12, the surface $S_1$ is embodied in the surface 28 of the chip 12, the I/O locations $\alpha_1, \alpha_2, \alpha_3, \ldots$ on the surface $S_1$ are embodied in I/O locations 13–15 and 43–45 and 53–55, the second electrical package $P_2$ is embodied in the chip carrier 16, the surface $S_2$ is embodied in the surface 29 of the chip carrier 16, the I/O locations $\beta_1, \beta_2, \beta_3, \ldots$ on the surface $S_2$ are embodied in I/O locations 17–19 and 47–49 and 57–59, and the electrical nets $N_1, N_2, N_3, \ldots$ are embodied in the electrical nets 31–33.

The general electrical structure of FIG. 4 may be arrived at by the following design process. An I/O connectivity list $I_1$ for the first electrical package $P_1$ is provided, wherein $I_1$ includes the I/O locations $\alpha_1, \alpha_2, \alpha_3, \ldots$ on the surface $S_1$ of the first electrical package $P_1$. An I/O connectivity list $I_2$ for the second electrical package $P_2$ is also provided, wherein $I_2$ includes I/O locations $\beta_1, \beta_2, \beta_3, \ldots$ on the surface $S_2$ of the second electrical package $P_2$. A designer may use the I/O connectivity lists $I_1$ and $I_2$ to develop the netlist L that describes the electrical nets $N_1, N_2, N_3, \ldots$ between the I/O locations $\alpha_1, \alpha_2, \alpha_3, \ldots$ on $S_1$ and the I/O locations $\beta_1, \beta_2, \beta_3, \ldots$ on $S_2$. The netlist L may be cast in a form of an input file to a design software package such as, inter alia, the CADENCE® software package of the Allegro Company. The input file may contain, however, errors due to such factors as reformatting errors or design errors made by the designer. Said errors may include mutual inconsistencies between the I/O locations in L and the I/O locations in I, wherein I denotes $I_1$ and $I_2$ collectively. Thus a relationship exists between L and I, wherein the relationship is either a mutually consistent relationship or a mutually inconsistent relationship (i.e., not a mutually consistent relationship). A necessary condition for the relationship between L and I to be a mutually consistent relationship is that the I/O locations in L and the I/O locations in I are mutually consistent. By definition herein, the I/O locations in L and the I/O locations in I are mutually consistent if each I/O location in I is accounted for in L (i.e., present in L) and each I/O location in L is accounted for in I (i.e., present in I).

Figure 5:
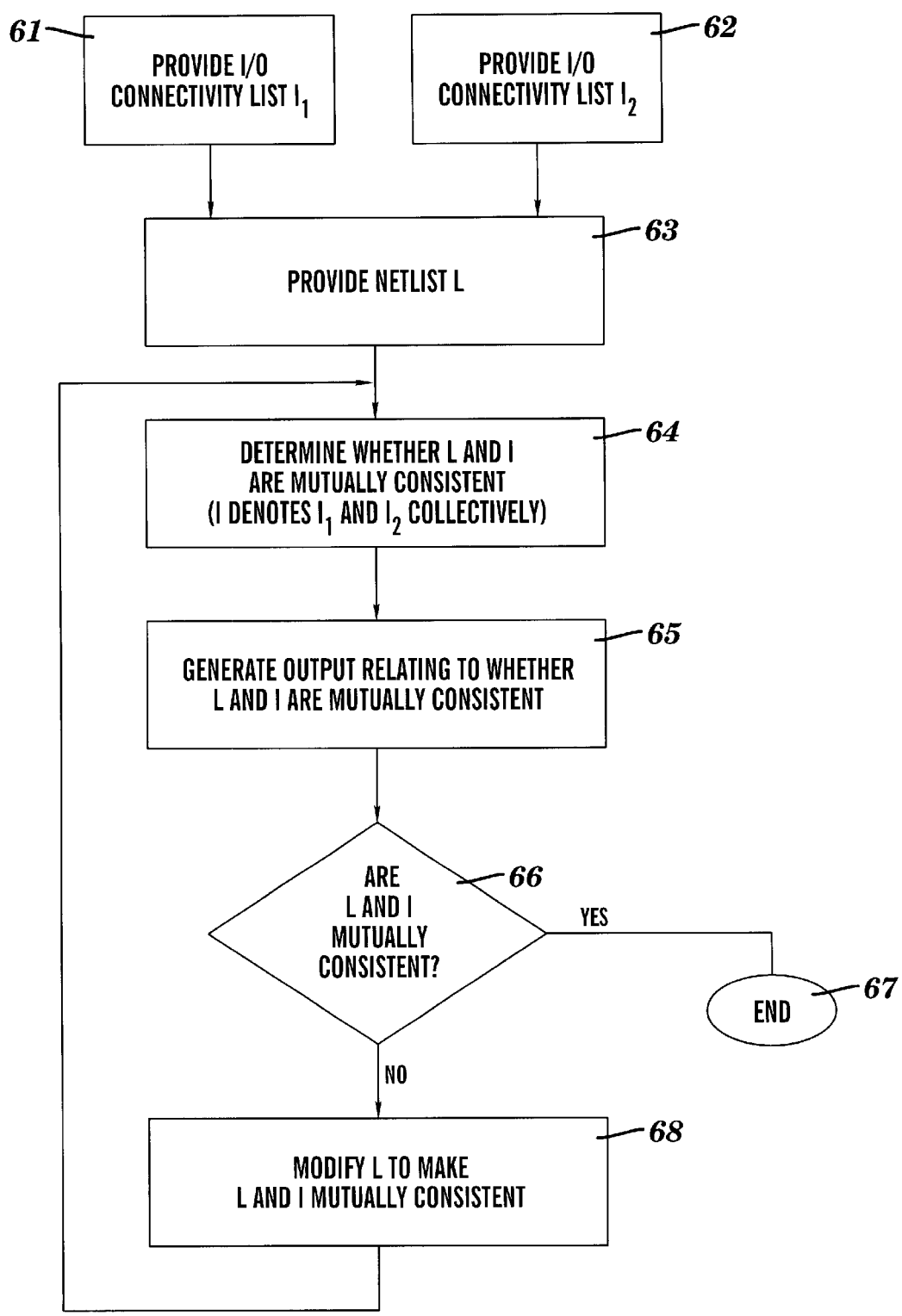
FIG. 5 is a flow chart showing a method of checking a netlist, in accordance with embodiments of the present invention.

FIG. 5 is a flow chart showing a method of checking the netlist L, in accordance with embodiments of the present invention. In step 61, the I/O connectivity list $I_1$ is provided, and in step 62, the I/O connectivity list $I_2$ is provided. Steps 61 and 62 may be performed in parallel (as shown) or in sequence. The I/O connectivity lists $I_1$ and $I_2$ may each be in any data format such as, inter alia, a file, a table, a database, a spreadsheet, etc. In step 63, the netlist L is provided. The netlist L may be in any data format such as, inter alia, a file, a table, a database, a spreadsheet, etc. In an embodiment, the netlist L may conform to the input form requirements of a design software package such as, inter alia, the CADENCE® software package. A possible scenario is, inter alia, that the netlist designer first creates the netlist ("first netlist"), such as from knowledge of $I_1$ and $I_2$; then the designer creates a design (e.g., by using the design software package); then the designer again creates the netlist ("second netlist"). The second netlist may differ from the first netlist for any reason such as from errors that occur between generation of the first netlist and the second netlist. The netlist L in step 63 could be, inter alia, the first netlist or the second netlist. As stated supra, a relationship exists between L and I such that the I/O locations in L and the I/O locations in I are either mutually consistent or mutually inconsistent, and accordingly the relationship between L and I is either a mutually consistent relationship or a mutually inconsistent relationship. Step 64 determines whether the relationship between L and I is a mutually consistent relationship. Step 65 generates output relating to whether L and I have been determined in step 64 to be mutually consistent. Step 66 is a decision block which makes a decision based on whether L and I have been determined in step 64 to be mutually consistent. If step 64 has determined that the relationship between L and I is mutually consistent, then step 66 makes the decision to next execute step 67 which ends the method. If step 64 has instead determined that said relationship between L and I is mutually inconsistent (i.e., not mutually consistent), then step 66 makes the decision to next execute step 68. Step 68 modifies L in an effort to make the relationship between L and I become a mutually consistent relationship. Step 68 may be implmented in software or manually. After step 68 is executed, step 64 is reentered and steps 64–66 and 67/68 are again executed in a next iteration. Steps 64–66 and 67/68 may be reexecuted in as many iterations as is needed to ultimately arrive at the mutually consistent relationship between L and I. The method of FIG. 5 may be implemented in an algorithm within a computer system, such as the computer system 90 described infra in conjunction with FIG. 12. The method of FIG. 5 may be comprise any modification (e.g., a modification in logic) that would be apparent to a person of ordinary skill in the art.

In addition to including I/O locations on the surface $S_1$ of the first electrical structure $P_1$, the I/O connectivity list $I_1$ may also specify an energy type $E_1$ at each of said I/O locations on $S_1$, respectively. For example, an energy type $E_1$ may exist at each of I/O locations $\alpha_1, \alpha_2, \alpha_3, \ldots$ on the surface $S_1$ in FIG. 4, and the energy type $E_1$ may differ from one another at the various I/O locations $\alpha_1, \alpha_2, \alpha_3, \ldots$ Similarly, in addition to including I/O locations on the surface $S_2$, the I/O connectivity list $I_2$ may specify an energy type $E_2$ at each of said I/O locations on $S_2$. For example, an energy type $E_2$ may exist at each of I/O locations $\beta_1, \beta_2, \beta_3, \ldots$ on the surface $S_2$ in FIG. 4, and the energy type $E_2$ may differ from one another at the various I/O locations $\beta_1, \beta_2, \beta_3, \ldots$ In an embodiment, the energy types $E_1$ at each of said I/O locations on the surface $S_1$ is a "ground", a "voltage", a "null type", or a "signal type"; and the energy types $E_2$ at each of said I/O locations on the surface $S_2$ is a "ground", a "voltage", a "null type", or a "signal type". A "ground" is a zero voltage level. A "voltage" is a constant voltage level, where the numerical value of the constant voltage level is indicated in the specification of $E_1$. Note that a "ground" is logically unnecessary and may either exist for convenience or not exist, since a "ground" is a special case of a "voltage" at a zero voltage level and is therefore within the scope of a "voltage". A "null type" denotes an absence of a ground, voltage, and signal type. An electrical contact such as a solder ball does not exist at a null spatial point. A "signal type" denotes an electrical signal (voltage or current) having a time-dependent profile such as, inter alia, a succession of pulses, wherein successive pulses are separated by a zero pulse level. The signal type may be one of a generic signal, a class signal, and a specific signal. A generic signal is a signal whose time dependence is open-ended and thus unspecified. A class signal is a signal subject to stated constraints but the signal is not totally constrained. As an example, a class signal may be a periodic signal whose period lies between stated numerical limits of a minimum period and a maximum period. As another example, a class signal may be a phase lock looping type signal. A specific signal is a signal whose time dependence is totally specified.

In an embodiment, the signal type of the energy type $E_1$ is a specific signal, and the signal type of the energy types $E_2$ is a generic signal, a class signal, or a specific signal. Such an embodiment may be relevant for the electrical structure 10 of FIGS. 1–3 such that the first electrical structure $P_1$ comprises a chip (e.g., the chip 12) and the second electrical structure $P_2$ comprises a chip carrier (e.g., the chip carrier 16).

A necessary condition for the relationship between L and I to be mutually consistent may be that the energy types in L and the energy types in I are mutually consistent. By definition herein, the energy types in L and the energy types in I are mutually consistent if each energy type in I is accounted for in L (i.e., present in L at the I/O location specified in I) and each energy type in L is accounted for in I (i.e., present in I at the I/O location specified in L). The preceding necessary condition relating to mutual consistency of energy types in L and I is in addition to the other necessary condition stated supra relating to the mutual consistency of the I/O locations in L and I.

FIGS. 6–11 next present an example illustrating the I/O connectivity lists, netlists, and output from mutual consistency comparisons, in accordance with embodiments of the present invention.

FIG. 6A depicts an I/O connectivity list $I_1$ of I/O locations and associated energy types on a surface $S_1$ of first electrical package $P_1$, in accordance with embodiments of the present invention. Each line of FIG. 6A is identified by a sequence number (i.e., "Seq#"), which represents an I/O location and an energy type associated with said I/O location. Each I/O location is identified by a symbolic character string. For example, sequence number 5 represents the I/O location "FA" having an associated energy type VD1. The energy types in FIG. 6A comprise a ground (GND), voltage (VDn, n=an integer), a null type (NULL), a generic signal (SIG), a class signal (PLLm, m=1,2,3, . . . ), and a specific signal (SIGk, k=an integer). The integer "n" in VDn identifies a voltage level. The PLLm signal class stands for a phase lock looping signal class of type m (.e., each value of m identifies a different phase lock looping signal class).

FIG. 6B depicts a list of cartesian coordinate values $(X_1, Y_1)$ for each I/O location of the surface $S_1$ of a first electrical package $P_1$ of FIG. 6A, in accordance with embodiments of the present invention. The magnitude of $(X_1, Y_1)$ depends on where the origin of coordinates (0,0) is located and on the units (e.g., microns, mm, mils, etc.) used to express linear dimensions. The use of cartesian coordinates is merely illustrative and any other expression of I/O location (e.g., polar coordinates) could alternatively be used.

FIG. 7A depicts an I/O connectivity list $I_2$ of I/O locations and associated energy types on a surface $S_2$ of a second electrical package $P_2$, in accordance with embodiments of the present invention. Each line of FIG. 7A is identified by a sequence number (i.e., "Seq#"), which represents an I/O location and an energy type associated with said I/O location. Each I/O location is identified by a symbolic character string, using the same nomenclature that was described supra in conjunction with FIG. 6A. Generally, the character strings identifying I/O locations on the surface $S_2$ may differ from, and are independent of, the character strings identifying I/O locations on the surface $S_1$. The I/O locations in FIGS. 6A and 7A are sequenced similarly in that corresponding I/O locations (with respect to nets that connect said corresponding points) are sequenced in the same order in FIGS. 6A and 7A. Generally, however, the I/O locations in FIGS. 6A and 7A may be independently sequenced in any order.

FIG. 7B depicts a list of cartesian coordinate values $(X_2, Y_2)$ for each I/O location of the surface $S_2$ of first electrical package $P_2$ of FIG. 7A, in accordance with embodiments of the present invention. The magnitude of $(X_2, Y_2)$ depends on where the origin of coordinates (0,0) is located and on the units (e.g., microns, mm, mils, etc.) used to express linear dimensions. The use of cartesian coordinates is merely illustrative and any other expression of I/O location (e.g., polar coordinates) could alternatively be used. Although FIGS. 6B and 7B express coordinate values in the same system of units, the coordinate values in may be expressed in different units. Additionally, the origin of coordinates differ for FIGS. 6B and 7B by the displacement vector (100, 200).

FIG. 8 depicts a netlist L of nets between I/O locations on the surface $S_1$ of FIG. 6A and I/O locations on the surface $S_2$ of FIG. 7A, in accordance with embodiments of the present invention. Each line of FIG. 8 is identified by a sequence number (i.e., "Seq#"), which represents a net that electrically couples I/O locations on the surface $S_1$ and with I/O locations on the surface $S_2$. The I/O locations in FIG. 8 are intended to be the same as the I/O locations in FIGS. 6A and 7A, except that the I/O locations in FIG. 8 may differ in format from the I/O locations in FIGS. 6A and 7A. For example, the I/O locations for $S_1$ in FIG. 8 are prefixed by "U1." relative to the I/O locations for $S_1$ in FIG. 6A. As another example, the I/O locations for $S_2$ in FIG. 8 are prefixed by "J1." relative to the I/O locations for $S_2$ in FIG. 7A. As an example of how to interpret the nets of FIG. 8, sequence number 9 identifies a net having the specific signal SIG21 between the I/O location DM on the surface $S_1$ and the I/O location D13 on the surface $S_2$.

In accordance with steps 64 and 65 of the method of FIG. 5, described supra, FIG. 9 depicts output (step 65) resulting from mutual consistency comparisons (step 64) between the I/O connectivity lists $I_1$ and $I_2$ of FIGS. 6A & 7A and the netlist L of FIG. 8. The mutual consistency comparisons of step 64 take into account formatting difference between the I/O connectivity lists $I_1$ and $I_2$ of FIGS. 6A & 7A and the netlist L of FIG. 8. For example, the mutual consistency comparisons of step 64 comprise stripping away the aforementioned "U1." and "J1." prefixes in FIG. 8. As another example, the mutual consistency comparisons of step 64 may comprise parsing portions of FIGS. 6A & 7A and/or FIG. 8.

In accordance with embodiments of the present invention, FIG. 9 identifies mutual inconsistencies in terms of I/O connectivity list parameters of FIGS. 6A and 7A which are unmatched in the netlist of FIG. 8, and also in terms of the netlist parameters of FIG. 8 which are unmatched in the I/O connectivity lists of FIGS. 6A and 7A. The mismatches denoted in FIG. 9 result from errors in the nets of sequence numbers 3, 6, 17, and 18 in FIG. 8. In the net of sequence number 3, the I/O location of surface $S_1$ should be U1.DW and not U1.DV. In the net of sequence number 6, the energy type should be VD2 and not VD3. In the net of sequence number 17, the energy type should be GND and not VD4. In the net of sequence number 18, the energy type should be SIG27 and not SIG28, the I/O location of surface $S_1$ should be U1.BH and not U1.BB, and the I/O location of surface $S_2$ should be J1.B08 and not J1.B02. While FIG. 9 identifies mutual inconsistencies, the output step 65 may also include an identification of mutual consistencies in terms of I/O connectivity list parameters of FIGS. 6A and 7A which are matched in the netlist of FIG. 8, and also in terms of the netlist parameters of FIG. 8 which are matched in the I/O connectivity lists of FIGS. 6A and 7A.

FIG. 10 depicts a revised netlist $L_1$ of nets between I/O locations on the surface $S_1$ of FIG. 6A and I/O locations on the surface $S_2$ of FIG. 7A wherein the revised netlist is a modification of the netlist L of FIG. 8, in accordance with embodiments of the present invention. FIG. 10 results from an attempt to correct the errors in the netlist of FIG. 8, wherein said errors were identified in FIG. 9. Such an attempt to correct said errors is in accordance with step 68 of the method of FIG. 5, described supra.

FIG. 11 depicts output (step 65) resulting from mutual consistency comparisons (step 64) between the I/O connectivity lists $I_1$ and $I_2$ of FIGS. 6A & 7A and the netlist $L_1$ of FIG. 10. FIG. 11 reveals that the netlist $L_1$ of FIG. 10 and the I/O connectivity list I of FIGS. 6A and 7A (i.e., I denotes the I/O connectivity lists $I_1$ and $I_2$ of FIGS. 6A and 7A respectively) are mutually consistent.

Figure 12:
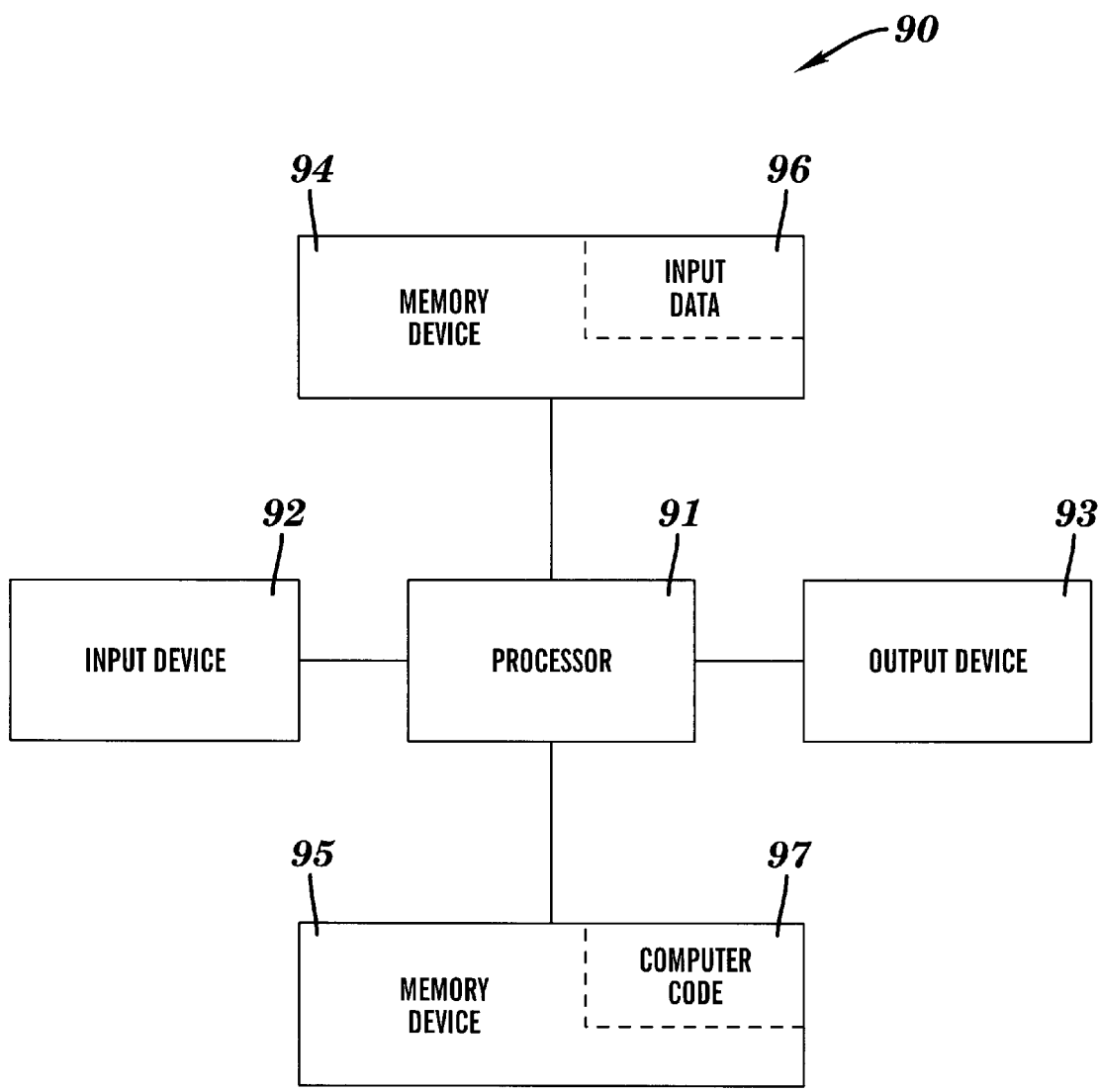
FIG. 12 depicts a computer system for checking a netlist, in accordance with embodiments of the present invention.

FIG. 12 illustrates a computer system 90 for checking a netlist L, in accordance with embodiments of the present invention. The computer system 90 comprises a processor 91, an input device 92 coupled to the processor 91, an output device 93 coupled to the processor 91, and memory devices 94 and 95 each coupled to the processor 91. The input device 92 may be, inter alia, a keyboard, a mouse, any other pointing device, etc. The output device 93 may be, inter alia, a printer, a plotter, a computer screen, a magnetic tape, a removable hard disk, a floppy disk, etc. The memory devices 94 and 95 may be, inter alia, a hard disk, a dynamic random access memory (DRAM), a read-only memory (ROM), etc. The memory device 95 includes a computer code 97. The computer code 97 includes an algorithm for checking the netlist L, wherein said algorithm is in accordance with the method described supra in conjunction with FIG. 5. The processor 91 executes the computer code 97. The memory device 94 includes input data 96. The input data 96 includes input required by the computer code 97. The output device 93 displays output from the computer code 97. In particular, the output device 93 includes the output medium and displays, inter alia, the output of FIGS. 9 and 11.

While FIG. 12 shows the computer system 90 as a particular configuration of hardware and software, any configuration of hardware and software, as would be known to a person of ordinary skill in the art, may be utilized for the purposes stated supra in conjunction with the particular computer system 90 of FIG. 12. For example, the memory devices 94 and 95 may be portions of a single memory device rather than separate memory devices.

While embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A method for checking a netlist L, comprising:
    providing an I/O connectivity list $I_1$ for a first electrical package $P_1$, wherein $I_1$ includes I/O locations on a surface $S_1$ of the first electrical package $P_1$;
    providing an I/O connectivity list $I_2$ for a second electrical package $P_2$, wherein $I_2$ includes I/O locations on a surface $S_2$ of the second electrical package $P_2$;
    providing the netlist L that describes electrical nets between I/O locations on $S_1$ and I/O locations on $S_2$, wherein I denotes $I_1$ and $I_2$ collectively, and wherein a first necessary condition for a relationship between L and I to be a mutually consistent relationship is that the I/O locations in L and the I/O locations in I are mutually consistent; and
    determining whether the relationship is the mutually consistent relationship.

2. The method of claim 1, wherein if the determining determines that the relationship is not the mutually consistent relationship then:
    modifying L directed to having the relationship become the mutually consistent relationship; and
    repeating determining whether the relationship is the mutually consistent relationship.

3. The method of claim 1, further comprising generating output relating to whether the relationship is the mutually consistent relationship.

4. The method of claim 3, wherein the output specifies each I/O location in I not accounted for in L, and wherein the output specifics each I/O location in L not accounted for in I.

5. The method of claim 1, wherein $I_1$ specifics an energy type $E_1$ at each of said I/O locations on $S_1$, wherein $I_2$ specifies an energy type $E_2$ at each of said I/O locations on $S_2$, wherein L specifies an energy type E for each electrical net in L, and wherein a second necessary condition for the relationship between L and I to be mutually consistent is that the energy types in L and the energy types in I are mutually consistent.

6. The method of claim 5, wherein the energy type $E_1$ at each of said I/O locations on $S_1$ is selected from the group consisting of a voltage, a null type, and a first signal type, and wherein the energy type $E_2$ at each of said I/O locations on $S_2$ is selected from the group consisting of a voltage, a null type, and a second signal type.

7. The method of claim 6, wherein the first signal type is a specific signal, and wherein the second signal type is selected from the group consisting of a generic signal, a class signal, and a specific signal.

8. The method of claim 5, further comprising generating output relating to whether the relationship is the mutually consistent relationship.

9. The method of claim 8, wherein the output specifies each I/O location in I not accounted for in L, wherein the output specifies each I/O location in L not accounted for in I, wherein the output specifies each energy type in I not accounted for in L, and wherein the output specifies each energy type in L not accounted for in I.

10. The method of claim 1, wherein the first electrical package $P_1$ comprises an integrated circuit chip, wherein the I/O locations on the surface $S_1$ comprise Controlled Collapse Chip Connection (C4) attachment points, wherein the second electrical package $P_2$ comprises a circuit carrier, and wherein the I/O locations on the surface $S_2$ comprise ball grid array (BGA) attachment points.

11. A computer system for checking a netlist L, comprising an algorithm adapted to:

access an I/O connectivity list $I_1$ for a first electrical package $P_1$, wherein $I_1$ includes I/O locations on a surface $S_1$ of the first electrical package $P_1$;

access an I/O connectivity list $I_2$ for a second electrical package $P_2$, wherein $I_2$ includes I/O locations on a surface $S_2$ of the second electrical package $P_2$;

access the netlist L that describes electrical nets between I/O locations on $S_1$ and I/O locations on $S_2$, wherein I denotes $I_1$ and $I_2$ collectively, and wherein a first necessary condition for a relationship between L and I to be a mutually consistent relationship is that the I/O locations in L and the I/O locations in I are mutually consistent; and determine whether the relationship is the mutually consistent relationship.

12. The computer system of claim 11, wherein the algorithm is further adapted to generate output relating to whether the relationship is the mutually consistent relationship.

13. The computer system of claim 12, wherein the output specifies each I/O location in I not accounted for in L, and wherein the output specifies each I/O location in L not accounted for in I.

14. The computer system of claim 11, wherein $I_1$ specifies an energy type $E_1$ at each of said I/O locations on $S_1$, wherein $I_2$ specifies an energy type $E_2$ at each of said I/O locations on $S_2$, wherein L specifies an energy type E for each electrical net in L, and wherein a second necessary condition for the relationship between L and I to be mutually consistent is that the energy types in L and the energy types in I are mutually consistent.

15. The computer system of claim 14, wherein the energy type $E_1$ at each of said I/O locations on $S_1$ is selected from the group consisting of a voltage, a null type, and a first signal type, and wherein the energy type $E_2$ at each of said I/O locations on $S_2$ is selected from the group consisting of a voltage, a null type, and a second signal type.

16. The method of claim 15, wherein the first signal type is a specific signal, and wherein the second signal type is selected from the group consisting of a generic signal, a class signal, and a specific signal.

17. The computer system of claim 14, wherein the algorithm is further adapted to generate output relating to whether the relationship is the mutually consistent relationship.

18. The computer system of claim 17, wherein the output specifies each I/O location in I not accounted for in L, wherein the output specifies each I/O location in L not accounted for in I, wherein the output specifies each energy type in I not accounted for in L, and wherein the output specifies each energy type in L not accounted for in I.

19. The computer system of claim 11, wherein the first electrical package $P_1$ comprises an integrated circuit chip, wherein the I/O locations on the surface $S_1$ comprise Controlled Collapse Chip Connection (C4) attachment points, wherein the second electrical package $P_2$ comprises a circuit carrier, and wherein the I/O locations on the surface $S_2$ comprise ball grid array (BGA) attachment points.

20. A computer program product, comprising a computer usable medium having a computer readable program code embodied therein for checking a netlist L, wherein the computer readable program code comprises an algorithm adapted to:

access an I/O connectivity list $I_1$ for a first electrical package $P_1$, wherein $I_1$ includes I/O locations on a surface $S_1$ of the first electrical package $P_1$;

access an I/O connectivity list $I_1$ for a second electrical package $P_2$, wherein $I_2$ includes I/O locations on a surface $S_2$ of the second electrical package $P_2$;

access the netlist L that describes electrical nets between I/O locations of $S_1$ of $P_1$ and I/O locations on $S_2$, wherein I denotes $I_1$ and $I_2$ collectively, and wherein a first necessary condition for a relationship between L and I to be a mutually consistent relationship is that the I/O locations in L and the I/O locations in I are mutually consistent; and determine whether the relationship is the mutually consistent relationship.

* * * * *